United States Patent
Otsuka

(10) Patent No.: US 8,330,423 B2
(45) Date of Patent: Dec. 11, 2012

(54) ELECTRONIC APPARATUS AND BATTERY CHECK METHOD

(75) Inventor: Genta Otsuka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 780 days.

(21) Appl. No.: 12/182,680

(22) Filed: Jul. 30, 2008

(65) Prior Publication Data

US 2009/0039892 A1 Feb. 12, 2009

(30) Foreign Application Priority Data

Aug. 10, 2007 (JP) .................................. 2007-210297

(51) Int. Cl.
*H02J 7/00* (2006.01)
*H02H 3/00* (2006.01)

(52) U.S. Cl. .......................... 320/136; 320/134; 361/101

(58) Field of Classification Search .................. 320/135, 320/136, 134; 361/87, 93.1, 93.4, 93.9, 98, 361/100, 101
See application file for complete search history.

(56) References Cited

U.S. PATENT DOCUMENTS 5,061,898 A * 10/1991 Oram et al. .................... 324/427
6,823,274 B2 * 11/2004 Zimmerman et al. .......... 702/63

FOREIGN PATENT DOCUMENTS

| JP | 11-007984 A | 1/1999 |
| JP | 2000-338582 A | 12/2000 |
| JP | 2001-076762 A | 3/2001 |
| JP | 2001-228222 A | 8/2001 |
| JP | 2003-084050 | 3/2003 |
| JP | 2005-151696 A | 6/2005 |

OTHER PUBLICATIONS

Aug. 5, 2011 Japanese Office Action, which is enclosed without an English Translation, that issued in Japanese Patent Application No. 2007-210297.
Jul. 2, 2012 Japanese Office Action, which is enclosed without an English Translation, that issued in Japanese Patent Application No. 2007-210297.

* cited by examiner

*Primary Examiner* — Richard V Muralidar
(74) *Attorney, Agent, or Firm* — Cowan, Liebowitz & Latman, P.C.

(57) ABSTRACT

An electronic apparatus which detects a remaining level of a battery used as a power supply, comprising a current detection unit configured to detect a current value flowing through a circuit of the electronic apparatus, a voltage detection unit configured to detect a voltage value of the battery, and a calculation unit configured to calculate a voltage value of the battery when a consumption current of the electronic apparatus is a predetermined consumption current, based on current values and voltage values detected by the current detection unit and the voltage detection unit, respectively, in a plurality of states different in the consumption current of the electronic apparatus.

8 Claims, 6 Drawing Sheets

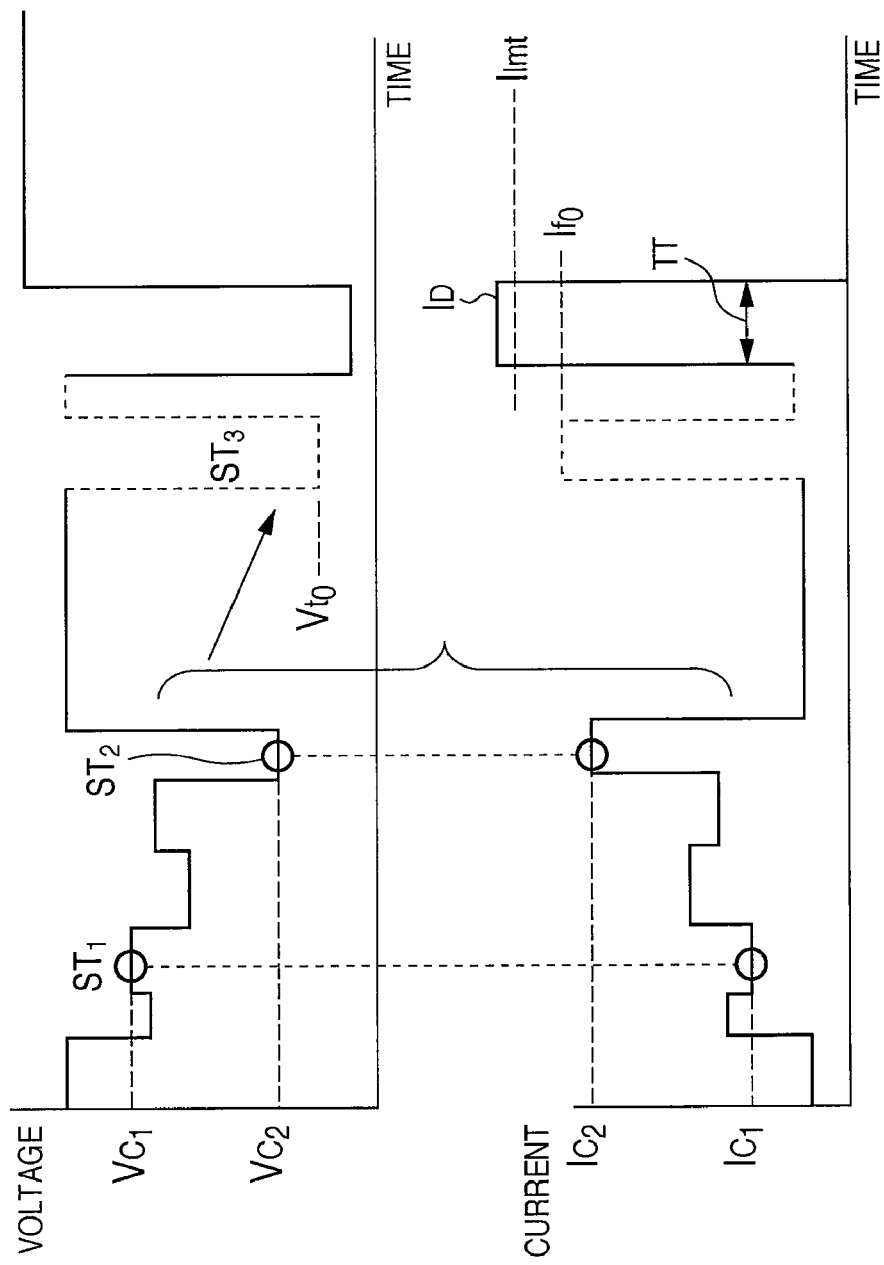
F I G. 6A
F I G. 6B

ELECTRONIC APPARATUS AND BATTERY CHECK METHOD

BACKGROUND OF THE INVENTION

1. Field of the Invention

The present invention relates to an electronic apparatus and battery check method which detect the remaining level of a battery used as a power supply.

2. Description of the Related Art

In recent years, a digital camera and digital video camera are becoming prevalent as image capturing apparatuses. These cameras form an image of light from an object on an image capturing element via an optical lens, thereby capturing and recording a digital image of the object. Such image capturing apparatuses perform a battery check for detecting the remaining battery level from the battery terminal voltage to guarantee the image capturing operation and notify the user of the battery replacement period. Note that the terminal voltage (voltage value) of a battery fluctuates due to, for example, internal resistance characteristic and circuit load. To cope with this situation, there has conventionally proposed a technique for precisely (accurately) detecting the remaining battery level (see Japanese Patent Laid-Open No. 2003-084050).

Japanese Patent Laid-Open No. 2003-084050 stores the consumption currents (consumption current values) of a plurality of circuits in a memory, and detects the battery terminal voltage values in two states different in consumption current, in accordance with each circuit operation condition. The consumption currents of the respective circuits, which are operating in these states, are read out from the memory. Using a value obtained by adding (combining) the readout consumption currents, the battery terminal voltage value in the state of a predetermined consumption current is predicted, thereby detecting the remaining battery level.

For example, a terminal voltage value Vfo of a battery in the state of a predetermined consumption current Ifo is calculated by:

$$Vfo = Vc2' - (Vc1' - Vc2') \cdot (Ifo - Ic2)/(Ic2' - Ic') \quad (1)$$

where $Ic1'$ is the current value in a first state, $Vc1'$ is the terminal voltage value of the battery in the first state, $Ic2'$ is the current value in a second state, and $Vc2'$ is the terminal voltage value of the battery in the second state.

However, Japanese Patent Laid-Open No. 2003-084050 obtains the current values $Ic1'$ and $IC2'$ by adding the consumption currents of the individual circuits, which are operating in the first state and second state and stored in advance. For this reason, when a variation (i.e., a shift (error) from the consumption current stored in the memory) occurs in the actual consumption current of each circuit, an error may be generated in the calculated terminal voltage value Vfo of the battery. Particularly when the difference between the current values $Ic1'$ and $Ic2'$ is relatively small, the error of the consumption current value of each circuit has a large adverse influence on the calculation accuracy of the terminal voltage value Vfo of the battery. This makes it difficult to precisely calculate the terminal voltage value Vfo of the battery.

Also, combinations of the consumption current values which constitute the current values $Ic1'$ and $Ic2'$ are determined in advance. This limits the timing at which the current values $Ic1'$ and $Ic2'$ are predicted to be flowing and the battery terminal voltage value is detected. This, in turn, limits the battery check timing, resulting in a decrease in the degree of freedom of a sequence. In particular, as the circuit scale increases, the timing at which the battery terminal voltage value is detected is more likely to be further limited.

SUMMARY OF THE INVENTION

The present invention provides an electronic apparatus and battery check method which can accurately detect the remaining battery level at an arbitrary timing.

According to one aspect of the present invention, there is provided an electronic apparatus which detects a remaining level of a battery used as a power supply, comprises a current detection unit configured to detect a current value flowing through a circuit of the electronic apparatus, a voltage detection unit configured to detect a voltage value of the battery, and a calculation unit configured to calculate a voltage value of the battery when a consumption current of the electronic apparatus is a predetermined consumption current, based on current values and voltage values detected by the current detection unit and the voltage detection unit, respectively, in a plurality of states different in the consumption current of the electronic apparatus.

According to another aspect of the present invention, there is provided a battery check method of detecting a remaining level of a battery in an apparatus which is driven by the battery and includes a current detection unit which detects a current value flowing through a circuit, and a voltage detection unit which detects a voltage value of the battery, comprises the steps of detecting a current value flowing through the circuit of the apparatus by the current detection unit in each of a plurality of states different in a consumption current of the apparatus, detecting a voltage value of the battery by the voltage detection unit in each of the plurality of states different in the consumption current of the apparatus, and calculating a voltage value of the battery when the consumption current of the apparatus is a predetermined consumption current, based on the current values and the voltage values detected in the step of detecting a current value and the step of detecting a voltage value, respectively.

Further features of the present invention will become apparent from the following description of exemplary embodiments with reference to the attached drawings.

BRIEF DESCRIPTION OF THE DRAWINGS

FIGS. 6A and 6B are timing charts for explaining the battery check operation of the digital camera shown in FIG. 5.

DESCRIPTION OF THE EMBODIMENTS

Figure 1:
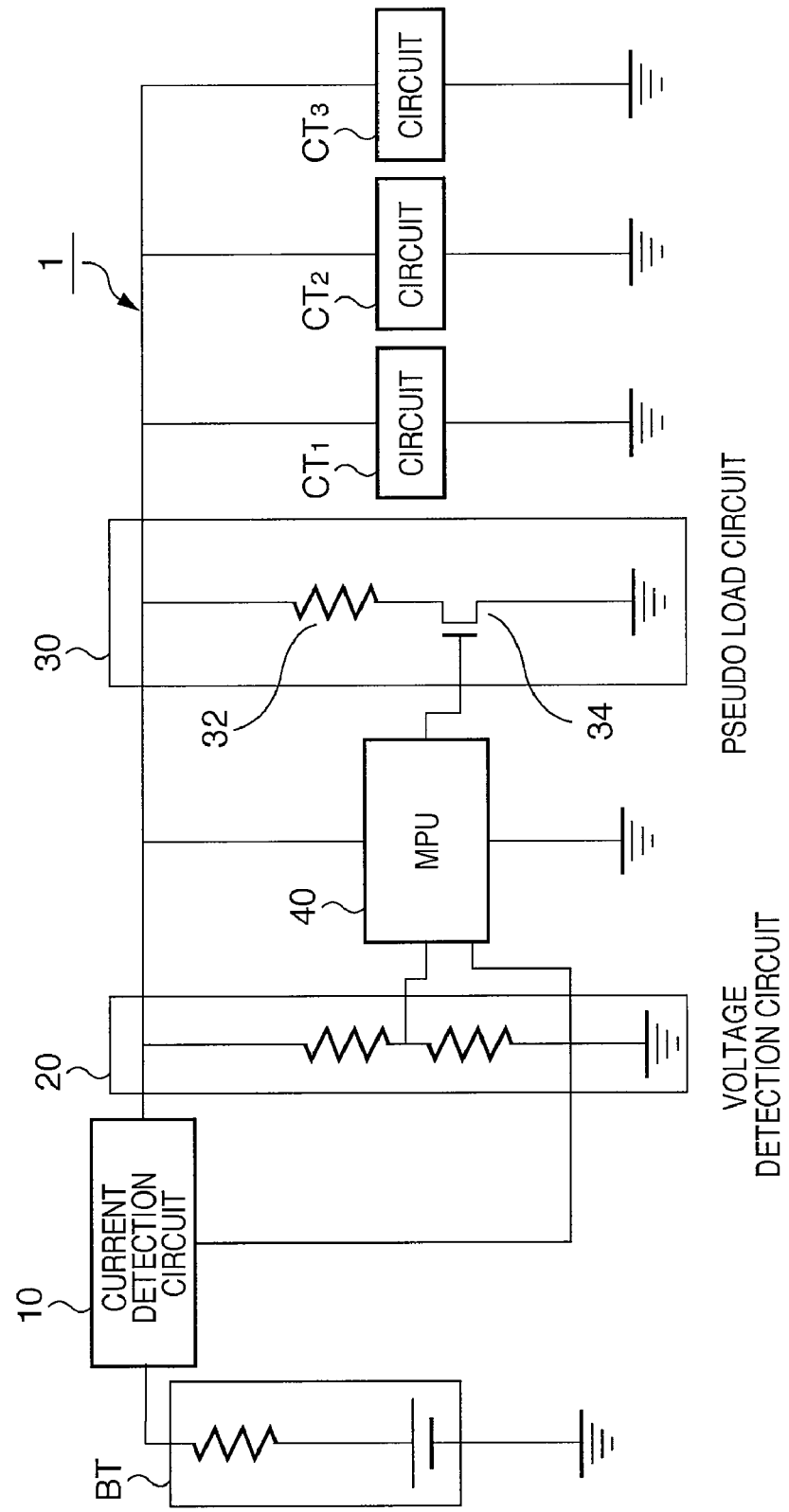
FIG. 1 is a schematic block diagram showing a digital camera according to the first embodiment of the present invention.

Preferred embodiments of the present invention will be described below with reference to the accompanying drawings. The same reference numerals denote the same members throughout the drawings, and a repetitive description thereof will not be given.

First Embodiment

FIG. 1 is a schematic block diagram showing a digital camera 1 having a battery check function according to the first embodiment of the present invention.

The digital camera 1 is an electronic apparatus having a battery check function of detecting the remaining level of a battery BT used as a power supply. The battery BT includes a resistance component (i.e., an internal resistance), and therefore its terminal voltage fluctuates depending on a current flowing through circuits $CT_1$, $CT_2$, and $CT_3$ (on the load side) of the electronic apparatus. The circuits $CT_1$, $CT_2$, and $CT_3$ include, for example, a circuit for driving an optical lens, a circuit for operating an image capturing element, and an LCD display circuit for displaying the result of a battery check by the digital camera 1.

As shown in FIG. 1, the digital camera 1 includes a current detection circuit 10, voltage detection circuit 20, pseudo load circuit 30, and MPU 40. Although not illustrated in FIG. 1, the digital camera 1 includes, for example, a regulator for converting the voltage of the battery BT to a predetermined one at the preceding stage of the MPU 40 and circuits $CT_1$, $CT_2$, and $CT_3$. The digital camera 1 regulates the voltage of the battery BT and supplies it to each device.

The current detection circuit 10 is connected between the battery BT and all circuits (the circuits $CT_1$, $CT_2$, and $CT_3$ in FIG. 1) of the apparatus, and detects a current (current value) flowing through all the circuits. The current detection circuit 10 includes, for example, a minute resistor connected between the battery BT and the circuits $CT_1$, $CT_2$, and $CT_3$, and an amplifier AMP for amplifying the voltage difference between the two ends of the minute resistor. Since the current detection circuit 10 can take any form known to those skilled in the art, a description of the detailed structure and operation thereof will not be given. The current detection circuit 10 outputs the detection result (the current value flowing through all the circuits of the apparatus) to the MPU 40.

The voltage detection circuit 20 detects the terminal voltage (terminal voltage value) of the battery BT. The voltage detection circuit 20 divides the terminal voltage of the battery BT at a predetermined division ratio, and outputs the voltage obtained by dividing the terminal voltage of the battery BT to the MPU 40. In other words, the voltage detection circuit 20 outputs the detection result (the terminal voltage value of the battery BT) to the MPU 40.

The pseudo load circuit 30 generates a plurality of states different in apparatus consumption current under the control of the MPU 40. The pseudo load circuit 30 includes a pseudo load resistor 32 and an FET 34 serially connected to the pseudo load resistor 32, and is connected between the ground (GND) and one terminal of the current detection circuit 10. The MPU 40 controls the operation of the FET 34. When the FET 34 is in operation, a predetermined current corresponding to the terminal voltage of the battery BT flows through the pseudo load resistor 32. This makes it possible to generate states different in apparatus consumption current from those when the FET 34 is not in operation.

The MPU 40 is a one-chip microcomputer which controls the respective units of the digital camera 1, and includes, for example, an arithmetic processor (calculator), memory, timer, A/D converter, and D/A converter. The MPU 40 controls the current detection circuit 10, voltage detection circuit 20, and pseudo load circuit 30. More specifically, the MPU 40 controls the operation of the FET 34 of the pseudo load circuit 30 (i.e., changes the FET 34 from a non-operation state to an in-operation state) to generate a plurality of states different in apparatus consumption current. The MPU 40 also controls the current detection circuit 10 and voltage detection circuit 20 to detect the current values and terminal voltage values, respectively, in the plurality of states. Based on the current values and terminal voltage values detected by the current detection circuit 10 and voltage detection circuit 20, respectively, in the plurality of states different in apparatus consumption current, the MPU 40 calculates the terminal voltage value of the battery BT when the apparatus consumption current is a predetermined one. This makes it possible to detect the remaining level of the battery BT.

Figures 2A, 2B:
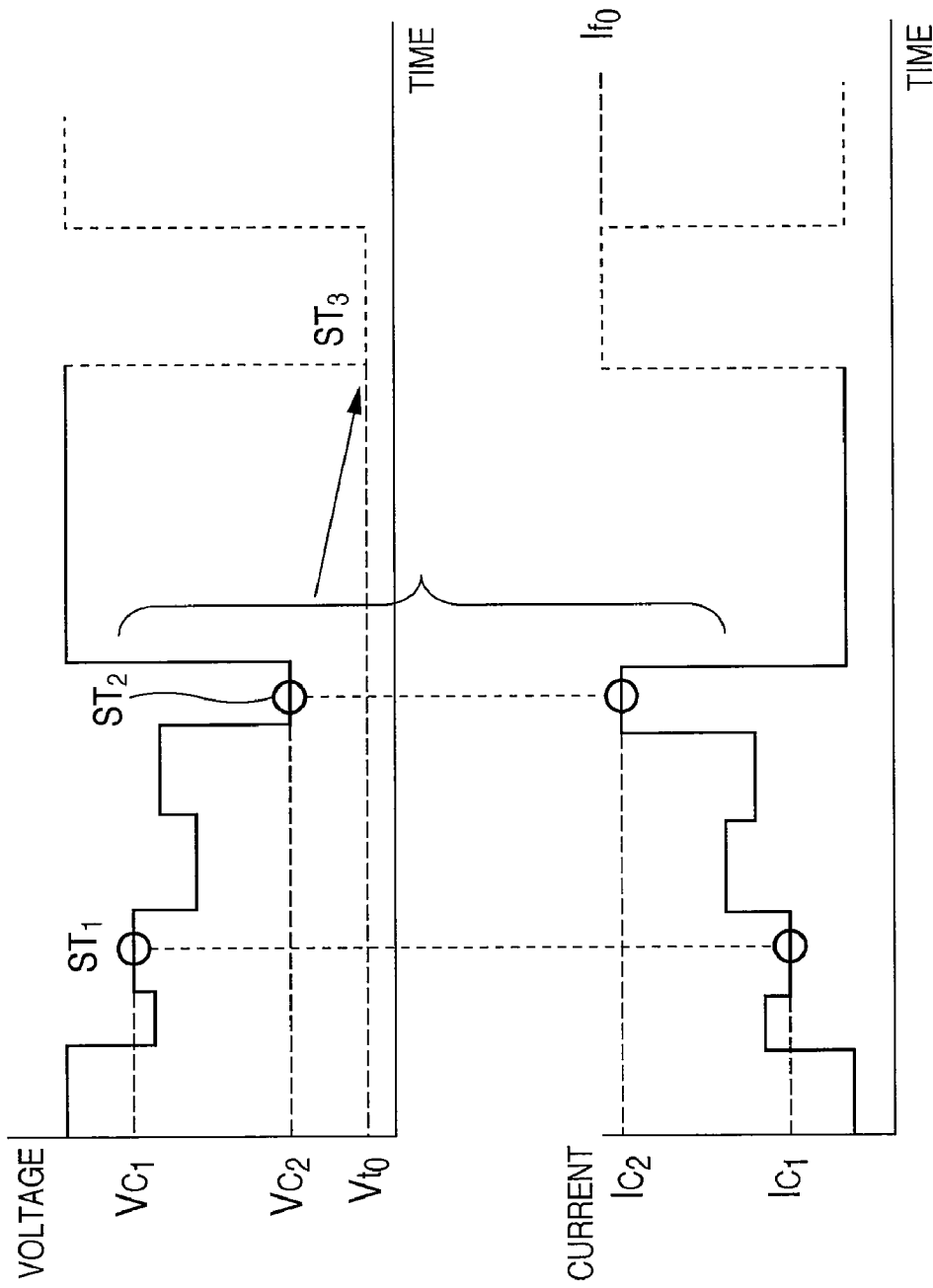
FIGS. 2A and 2B are timing charts for explaining the battery check operation of the digital camera shown in FIG. 1.

The operation of the digital camera 1 will be explained below with reference to FIGS. 2A and 2B. FIG. 2A is a timing chart showing the terminal voltage value of the battery BT (the detection result obtained by the voltage detection circuit 20) when the apparatus is in operation. FIG. 2B is a timing chart showing the current value flowing through all the circuits (the detection result obtained by the current detection circuit 10) when the apparatus is in operation.

First, in a state (timing) $ST_1$ in which the apparatus consumption current is a first consumption current, the current detection circuit 10 and voltage detection circuit 20 detect the current value flowing through all the circuits, and the terminal voltage value of the battery BT, respectively. In the state $ST_1$, the voltage detection circuit 20, MPU 40, and circuits $CT_1$, $CT_2$, and $CT_3$ are in operation in the digital camera 1. The current value is not uniform in the MPU 40 and circuits $CT_1$, $CT_2$, and $CT_3$ because their consumption currents differ from each other depending on the apparatus operation state. In the state $ST_1$, let Ic1 be the current value detected by the current detection circuit 10, and Vc1 be the terminal voltage value of the battery BT detected by the voltage detection circuit 20.

Next, the MPU 40 operates the FET 34 of the pseudo load circuit 30 to generate a state (timing) $ST_2$ in which the apparatus consumption current is a second consumption current different from the first consumption current. In the state $ST_2$, the current detection circuit 10 and voltage detection circuit 20 detect the current value flowing through all the circuits and the terminal voltage value of the battery BT, respectively. In the state $ST_2$, the voltage detection circuit 20, pseudo load circuit 30, MPU 40, and circuits $CT_1$, $CT_2$, and $CT_3$ are in operation in the digital camera 1. In the state $ST_2$, let Ic2 be the current value detected by the current detection circuit 10, and Vc2 be the terminal voltage value of the battery BT detected by the voltage detection circuit 20. Then, Ic1<Ic2 and Vc1>Vc2 are satisfied.

Lastly, based on the current value Ic1 and terminal voltage value Vc1, and the current value Ic2 and terminal voltage value Vc2 detected in the states $ST_1$ and $ST_2$, respectively, the MPU 40 calculates a terminal voltage value Vfo of the battery BT in a state (timing) in which the apparatus consumption current is a predetermined consumption current Ifo. More specifically, the terminal voltage value Vfo of the battery BT is calculated by:

$$Vfo=Vc2-(Vc1-Vc2)\cdot(Ifo-Ic2)/(Ic2-Ic1) \quad (2)$$

The current values Ic1 and Ic2 are actually detected by the current detection circuit 10, unlike the prior arts. It is therefore possible to precisely calculate the terminal voltage value Vfo of the battery BT.

In this manner, even when a battery which has a high internal resistance and whose terminal voltage largely fluctuates due to a circuit load is used, the digital camera 1 according to the first embodiment can precisely calculate the battery terminal voltage value when the apparatus consumption current is a predetermined one. Consequently, the digital camera 1 can accurately detect the remaining battery level using the calculated battery terminal voltage value. The terminal voltage value Vfo of the battery is compared with a plurality of battery-specific reference values determined in advance, thereby detecting the remaining battery level. Based on this detection result, the remaining battery level is displayed on an external display member.

The digital camera 1 can detect the remaining battery level at an arbitrary timing by adjusting the timings at which a plurality of states different in apparatus consumption current is generated (more specifically, the timings at which the pseudo load circuit 30 and FET 34 are operated). Consequently, the digital camera 1 can maintain the degree of freedom of a sequence. The FET 34 of the pseudo load circuit 30 is preferably operated so that the apparatus consumption current becomes a predetermined one. This makes it possible to calculate the battery terminal voltage value when the apparatus consumption current is a predetermined one with a higher accuracy.

Second Embodiment

Figure 3:
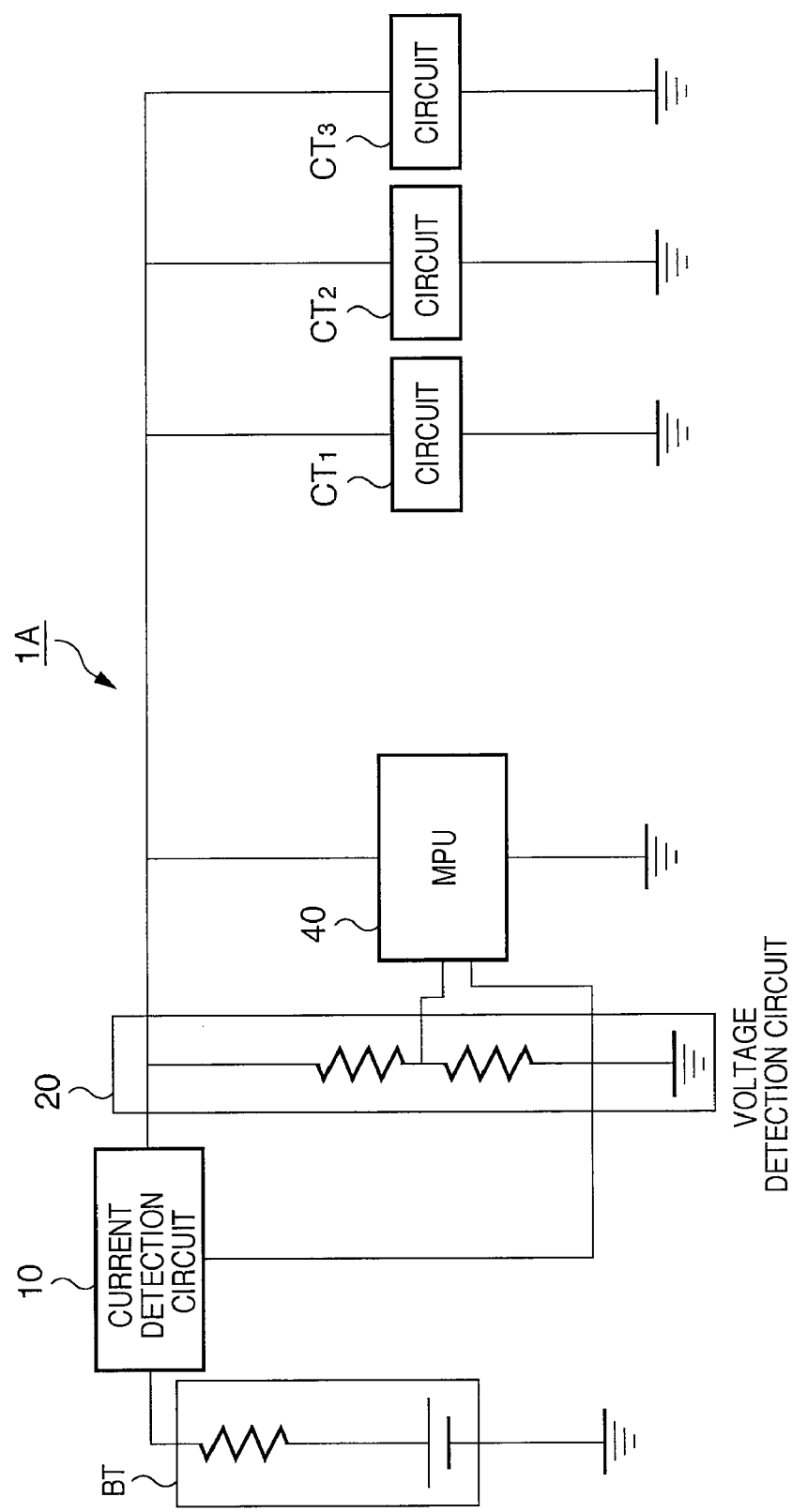
FIG. 3 is a schematic block diagram showing a digital camera according to the second embodiment of the present invention.

FIG. 3 is a schematic block diagram showing a digital camera 1A according to the second embodiment of the present invention.

As shown in FIG. 3, the digital camera 1A has an arrangement similar to that of the digital camera 1, but it does not have the pseudo load circuit 30 differently from the digital camera 1. An MPU 40 in the digital camera 1A controls a current detection circuit 10 and voltage detection circuit 20 to detect the current value flowing through all the circuits, and the terminal voltage value of a battery BT, respectively, in a plurality of states different in apparatus consumption current. More specifically, the MPU 40 stores the timings at which the apparatus consumption current enters a plurality of different states, and operates the current detection circuit 10 and voltage detection circuit 20 at these timings. For example, when the MPU 40 operates the current detection circuit 10 and voltage detection circuit 20 at the timings at which an actuator is operated or not operated, it is possible to obtain a plurality of states different in consumption current.

Figures 4A, 4B:
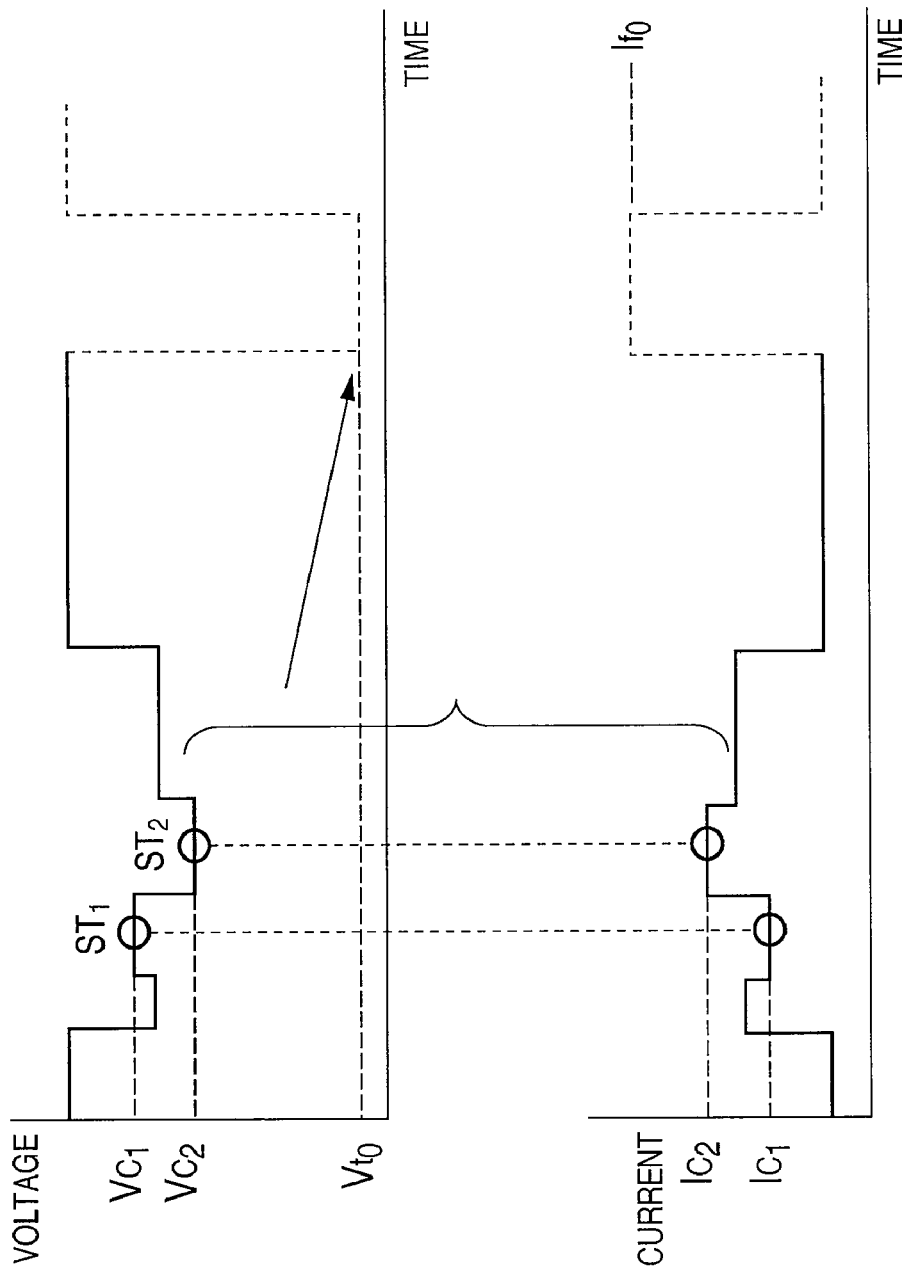
FIGS. 4A and 4B are timing charts for explaining the battery check operation of the digital camera shown in FIG. 3.

The operation of the digital camera 1A will be explained below with reference to FIGS. 4A and 4B. FIG. 4A is a timing chart showing the terminal voltage value of the battery BT (the detection result obtained by the voltage detection circuit 20) when the apparatus is in operation. FIG. 4B is a timing chart showing the current value flowing through all the circuits (the detection result obtained by the current detection circuit 10) when the apparatus is in operation.

First, in a state (timing) $ST_1$ in which the apparatus consumption current is a first consumption current, the current detection circuit 10 and voltage detection circuit 20 detect the current value flowing through all the circuits, and the terminal voltage value of the battery BT, respectively. In the state $ST_1$, the voltage detection circuit 20, the MPU 40, and circuits $CT_1$, $CT_2$, and $CT_3$ are in operation in the digital camera 1A. The current value is not uniform in the MPU 40 and circuits $CT_1$, $CT_2$, and $CT_3$ because their consumption currents differ from each other depending on the apparatus operation state. In the state $ST_1$, let Ic1 be the current value detected by the current detection circuit 10, and Vc1 be the terminal voltage value of the battery BT detected by the voltage detection circuit 20.

Next, the MPU 40 monitors a state (timing) $ST_2$ in which the apparatus consumption current is a second consumption current different from the first consumption current. In the state $ST_2$, the MPU 40 controls the current detection circuit 10 and voltage detection circuit 20 to detect the current value flowing through all the circuits and the terminal voltage value of the battery BT, respectively. In the state $ST_2$, the voltage detection circuit 20, MPU 40, and circuits $CT_1$, $CT_2$, and $CT_3$ are in operation in the digital camera 1A. Note that each circuit operates in a mode different from the state $ST_1$. In the state $ST_2$, let Ic2 be the current value detected by the current detection circuit 10, and Vc2 be the terminal voltage value of the battery BT detected by the voltage detection circuit 20. Then, Ic1<Ic2 and Vc1>Vc2 are satisfied.

Lastly, based on the current value Ic1 and terminal voltage value Vc1, and the current value Ic2 and terminal voltage value Vc2 detected in the states $ST_1$ and $ST_2$, respectively, the MPU 40 calculates a terminal voltage value Vfo of the battery BT in a state (timing) in which the apparatus consumption current is a predetermined consumption current Ifo. More specifically, the terminal voltage value Vfo of the battery BT is calculated by equation (2).

The current values Ic1 and Ic2 are actually detected by the current detection circuit 10, unlike the prior arts. It is therefore possible to precisely calculate the terminal voltage value Vfo of the battery BT.

As in the digital camera 1 according to the first embodiment, the digital camera 1A according to the second embodiment can accurately calculate the battery terminal voltage value when the apparatus consumption current is a predetermined one. Consequently, the digital camera 1A can accurately detect the remaining battery level using the calculated battery terminal voltage value.

Since the digital camera 1A does not use the pseudo load circuit 30, it can be manufactured more inexpensively than the digital camera 1.

Third Embodiment

Figure 5:
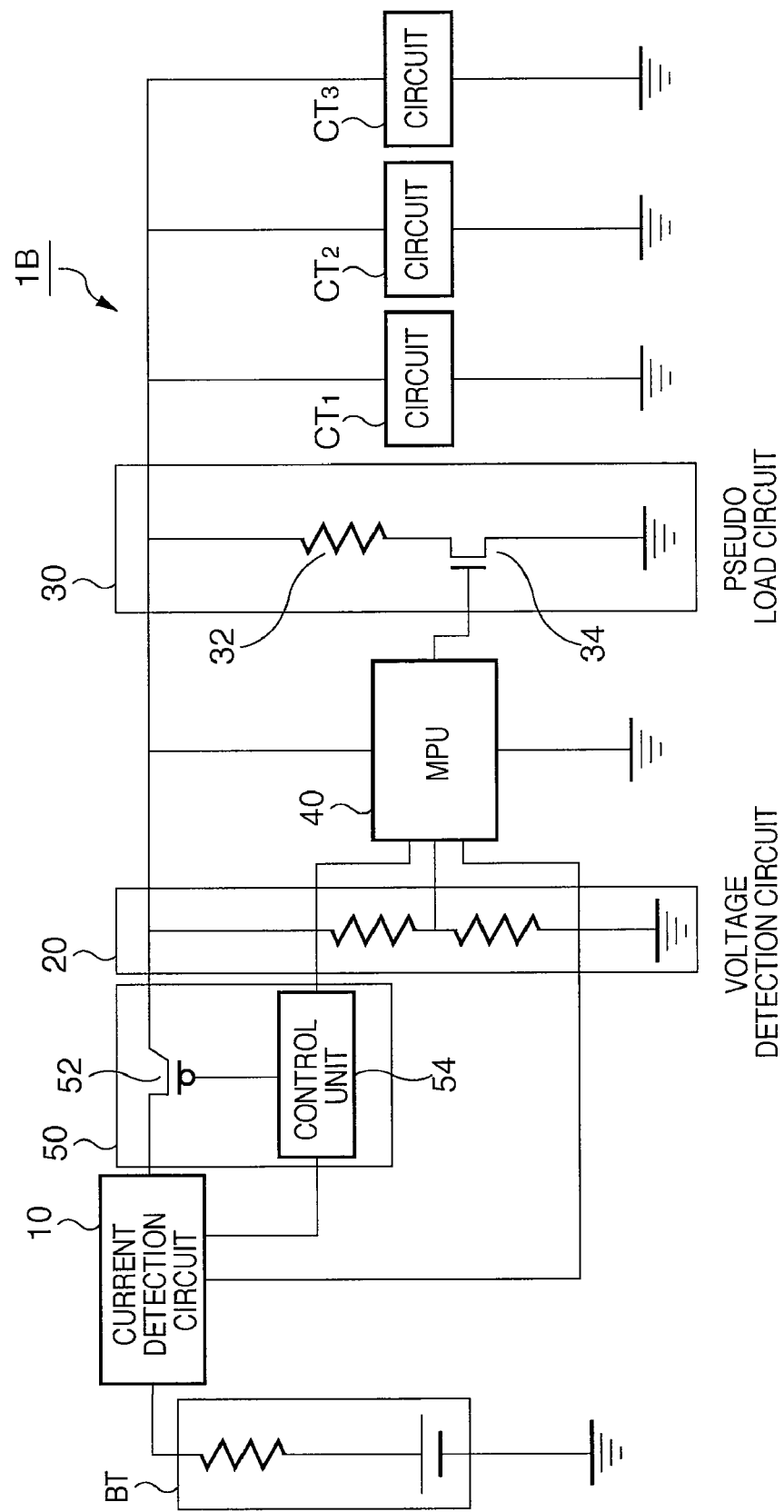
FIG. 5 is a schematic block diagram showing a digital camera according to the third embodiment of the present invention.

FIG. 5 is a schematic block diagram showing a digital camera 1B according to the third embodiment of the present invention.

As shown in FIG. 5, the digital camera 1B has an arrangement similar to that of the digital camera 1, but it additionally has a safety circuit 50.

The safety circuit 50 includes a load switch 52 and control unit 54. The load switch 52 is formed by an FET connected between a current detection circuit 10 and an MPU 40. The control unit 54 is connected to the load switch 52 via a control line to control the load switch 52. The control unit 54 is also connected to the current detection circuit 10 via a power line and an analog line to output the current value (A/D value) detected by the current detection circuit 10. The control unit 54 is also connected to the MPU 40 via a control line to set a control value for controlling the load switch 52 in accordance with the detection result obtained by the current detection circuit 10. The control unit 54 includes a register which stores, for example, a threshold to shut off the load switch 52 when the current detection circuit 10 has detected a current value equal to or larger than a predetermined value (e.g., equal to or larger than a predetermined consumption current), and a timer which measures the time for which a current value equal to or larger than the predetermined value has flowed.

The operation of the digital camera 1B will be explained below with reference to FIGS. 6A and 6B. FIG. 6A is a timing chart showing the terminal voltage value of a battery BT (the detection result obtained by a voltage detection circuit 20) when the apparatus is in operation. FIG. 6B is a timing chart showing the current value flowing through all the circuits (the detection result obtained by the current detection circuit 10) when the apparatus is in operation. Since an operation for detecting the remaining level of the battery BT by the digital camera 1B is the same as in the digital camera 1 according to the first embodiment, only the operation of the safety circuit 50 will be explained herein.

The safety circuit 50 shuts off the load switch 52 when the current detection circuit 10 has detected a current $I_D$, which is equal to or larger than a current value Ilmt (equal to or larger than a predetermined consumption current Ifo in this embodiment) preset in the control unit 54 by the MPU 40, for a time longer than a threshold TT. This makes it possible to shut off power (power supply) supplied to circuits $CT_1$, $CT_2$, and $CT_3$ for operating the apparatus, thereby stopping the apparatus operation. The safety circuit 50 may shut off the load switch 52 as soon as the current detection circuit 10 detects the current $I_D$ equal to or larger than the current value Ilmt (equal to or larger than the predetermined consumption current Ifo in this embodiment) preset in the control unit 54 by the MPU 40.

The digital camera 1B can shut off power (power supply) supplied to the circuits $CT_1$, $CT_2$, and $CT_3$ for operating the apparatus when a current equal to or larger than the predetermined consumption current Ifo, that is, an abnormal current is flowing through them. In this manner, the current detection circuit 10 used in detecting the remaining level of the battery BT can also be used in detecting an abnormal current.

The present invention is applicable not only to an image capturing apparatus but also to various kinds of electronic apparatuses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-210297 filed on Aug. 10, 2007, which is hereby incorporated by reference herein in its entirety.

What is claimed is:

1. An electronic apparatus comprising:
a current detection unit that detects a current flowing from a battery to the electronic apparatus;
a voltage detection unit that detects a voltage of the battery;
a detection unit that detects a remaining level of the battery based on a first current value, a second current value, a first voltage value, and a second voltage value; and
a control unit that stops flowing abnormal current from the battery to the electronic apparatus by controlling a switch unit to disconnect between the battery and a load unit of the electronic apparatus if a current detected by the current detection unit is not less than a predetermined value,
wherein the switch unit is connected between the battery and the load unit,
the control unit that does not control the switch unit to disconnect between the battery and the load unit if a current detected by the current detection unit is less than the predetermined value,
the first current value is detected by the current detection unit if the electronic apparatus is in a first state,
the second current value is detected by the current detection unit if the electronic apparatus is in a second state,
the first voltage value is detected by the voltage detection unit if the electronic apparatus is in the first state,
the second voltage value is detected by the voltage detection unit if the electronic apparatus is in the second state,
the second state is different from the first state, and
the first current value is less than the second current value.

2. A control method for controlling an electronic apparatus, the control method comprising:
detecting a current flowing from a battery to the electronic apparatus;
detecting a voltage of the battery;
detecting a remaining level of the battery based on a first current value, a second current value, a first voltage value, and a second voltage value; and
stopping flowing abnormal current from the battery to the electronic apparatus by controlling a switch unit to disconnect between the battery and a load unit of the electronic apparatus if a detected current is not less than a predetermined value,
not controlling the switch unit to disconnect between the battery and the load unit if a detected current is less than the predetermined value,
wherein the switch unit is connected between the battery and the load unit,
the first current value is detected if the electronic apparatus is in a first state,
the second current value is detected if the electronic apparatus is in a second state,
the first voltage value is detected if the electronic apparatus is in the first state,
the second voltage value is detected if the electronic apparatus is in the second state,
the second state is different from the first state, and
the first current value is less than the second current value.

3. The electronic apparatus according to claim 1, wherein the detection unit detects the remaining level based on a comparison of a predetermined voltage value and a plurality of reference values, and
the predetermined voltage value is calculated based on the first current value, the second current value, the first voltage value, and the second voltage value.

4. The electronic apparatus according to claim 1, wherein the first state is a state that a pseudo load unit of the electronic apparatus is not operated, and the second state is a state that the pseudo load unit is operated.

5. The electronic apparatus according to claim 1, wherein the electronic apparatus includes is a digital camera.

6. The control method according to claim 2, further comprising:
detecting the remaining level based on a comparison of a predetermined voltage value and a plurality of reference values, and
wherein the predetermined voltage value is calculated based on the first current value, the second current value, the first voltage value, and the second voltage value.

7. The control method according to claim 2, wherein the first state is a state that a pseudo load unit of the electronic apparatus is not operated, and the second state is a state that the pseudo load unit is operated.

8. The control method according to claim 2, wherein the electronic apparatus includes a digital camera.

* * * * *